United States Patent
Eberler et al.

[11] Patent Number: 6,100,693
[45] Date of Patent: Aug. 8, 2000

[54] ANTENNA FOR A MAGNETIC RESONANCE DEVICE

[75] Inventors: Ludwig Eberler, Postbauer-Heng; Peter Heubes, Poxdorf; Michael Moritz, Mistelgau; Bernd Stoeckel, Erlangen, all of Germany

[73] Assignee: Siemens Aktiengesellschaft, Munich, Germany

[21] Appl. No.: 09/086,398

[22] Filed: May 28, 1998

[30] Foreign Application Priority Data

May 28, 1997 [DE] Germany ............... 197 22 387

[51] Int. Cl.[7] .................................................. G01V 3/00
[52] U.S. Cl. ........................................ 324/318; 324/314
[58] Field of Search ................... 324/318, 322, 324/314, 300, 307, 309; 600/422; 62/51.5

[56] References Cited

U.S. PATENT DOCUMENTS

| | | | |
|---|---|---|---|
| 5,864,235 | 1/1999 | Moritz et al. | 324/318 |
| 5,913,888 | 6/1999 | Steinmeyer et al. | 62/51.1 |

FOREIGN PATENT DOCUMENTS

| | | |
|---|---|---|
| 2 616 911 | 6/1987 | France . |
| 38 39 046 | 5/1990 | Germany . |
| 40 13 111 | 10/1991 | Germany . |
| 42 18 635 | 5/1996 | Germany . |

*Primary Examiner*—Louis Arana
*Attorney, Agent, or Firm*—Hill & Simpson

[57] ABSTRACT

An antenna for a magnetic resonance device comprises an antenna conductor structure and capacitors connected thereto. The antenna conductor structure and/or the capacitors are connected to a water cooling system.

13 Claims, 5 Drawing Sheets

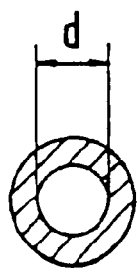
FIG 9.1
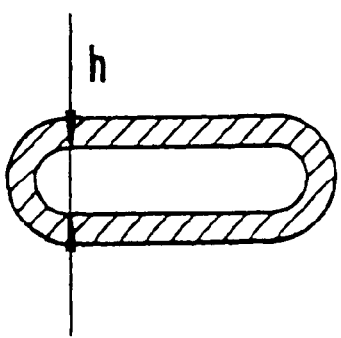
FIG 9.2
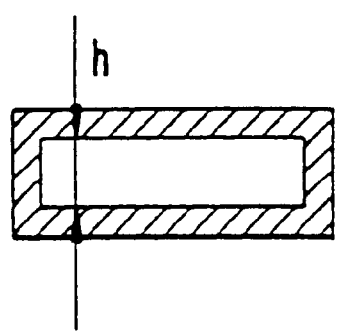
FIG 9.3
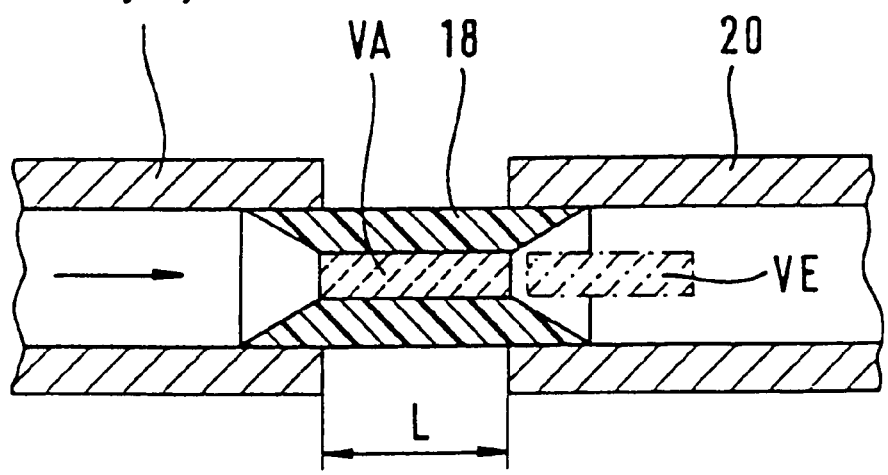
FIG 10

ANTENNA FOR A MAGNETIC RESONANCE DEVICE

BACKGROUND OF THE INVENTION

The invention relates to an antenna for a magnetic resonance device with an antenna conductor structure and capacitors connected thereto.

A diagnostic magnetic resonance device is formed of the assemblies basic field system, gradient system and whole-body high-frequency system, among others. The basic field system serves to make available a strong, static and homogenous magnetic field, typically of 0.1 to 4 T. The gradient system delivers a magnetic field which can be adjusted in the low-frequency region (typically up to 1 kHz) and which has a linearly rising, or respectively, falling characteristic in one or more spatial directions with a typical gradient up to 30 mT/m. The high-frequency system makes available a magnetic field for nuclear spin deflection or displacement. The field oscillates in the high frequency region, given an NMR frequency (42, 45 MHZ/T) that is essentially prescribed by the static basic magnetic field. The whole-body high-frequency system is also potentially utilized to receive the signals of the relaxing nuclear spin. In most magnetic resonance devices, these three assemblies surround a cylindrical patient examination space in a shell-like fashion in the sequence: high-frequency system, gradient system, basic field system. The high-frequency system is therein surrounded by a shielding in order to prevent a high-frequency irradiation to the gradient system. The assemblies are therein constructed essentially in the form of a cylinder cladding.

Since, for the most part, the price of the basic field magnet is determined by the free inner diameter (bore), this should be minimized. On the other hand, along with the free inner diameter of the basic field magnet, the thickness of the shell-like construction of gradient system and high-frequency system determine the diameter of the patient space. The thickness of the gradient system and the high-frequency system should thus be minimized in order to maximize the patient examination space.

French Patent Application No. 2 616 911 teaches a superconductive receiving antenna for magnetic resonance signals. A high-temperature superconductor formed of a copper oxide activated by means of rare earth is arranged in a tube or pipe of electrically non-conductive and thermally insulating material. The still free interior of the tube is penetrated by liquid nitrogen as a coolant. After cooling the antenna conductor, the liquid nitrogen reaches the free atmosphere via a valve.

German OS Application 40 13 111 discloses a superconductive receiving antenna in a bath cooling.

German PS Application 42 18 635 teaches an antenna of a metal-oxidic superconductor material with a capacitor having a layer structure of superconductive layer parts formed of the metal-oxidic superconductor material with an intervening solid dielectric layer.

SUMMARY OF THE INVENTION

It is an object of the invention to minimize the thickness in the shell-like construction of the high-frequency system in a diagnostic magnetic resonance device, in order to obtain an optimally large diameter of the patient examination space for a given inner diameter of the basic field magnet.

The object is achieved, in that the antenna conductor structure and/or the capacitors are connected to a water cooling system. The desired lower shell thickness of the high-frequency system simultaneously means a smaller separation of the high-frequency shield from the actual antenna. Thus, to achieve a minimum field strength (for a 180° flip angle) in connection with the high frequency shield, the lower thickness of the high-frequency system forces higher currents on the actual antenna, because the mirror current induced on the high-frequency shield partially compensates the useful field created in the patient examination space by the antenna. The high antenna currents create high losses in the antenna conductor structures and potentially in the resonance capacitors belonging to the antenna also. This exhaust heat is released through the water cooling system integrated according to the invention with the antenna. This exploits the fact that it is increasingly common to operate the gradient coils in a water-cooled fashion. A majority of the functional units necessary for the water-cooling of the high-frequency antenna are then present in the immediate vicinity. Since the coolant requirement of the high-frequency antenna is lower than that of the gradient coils by at least an order of magnitude, the antenna system can be connected to the gradient coil cooling system without great modifications.

In a particularly advantageous development, the coolant lines have an inner cross-section which is shielded with a high-frequency shielding against a penetration and escaping of high-frequency signals. Thus, coolant can also be utilized which would create imaging signals and thus image artifacts without high-frequency shielding. By means of the high-frequency shielding, such image artifacts are excluded.

For reasons of safety technology, and also in order to achieve a disability—with respect to the high frequency of individual cooling lines, the coolant lines comprise coolant line sections which are mutually connected via electrical disconnects.

Within the electrical disconnect, a coolant which is effective with respect to magnetic resonance is generally no longer shielded and can lead to image artifacts. In another advantageous development, such image artifacts are prevented, in that the electrical disconnects and the coolant line sections respectively possess an internal cross-section, and that the inner cross-section of the electrical disconnect is constructed smaller than the inner cross-section of the cooling line sections connected to the electrical disconnect. Due to the higher flow rate of the coolant in the electrical disconnect, it is assured that the coolant in the electrical disconnect is exchanged completely between the excitation and reception of NMR signals. The coolant is in fact excited in the electrical disconnect; however, in the receiving phase, the signals emitted, but the excited magnet cores are shielded, since the excited volume is then located inside the shielded coolant lines again.

In another advantageous development of the antenna, image artifacts created by coolant in the electrical disconnects can be avoided, in that the antenna structure is constructed essentially cylindrically, and the electrical disconnects are arranged at the side of the antenna conductor structure. The electrical disconnects are positioned in a region of the antenna where predominantly MR-ineffective field components are created—e.g. mainly components in the direction of the main magnetic field only.

In another advantageous development, the inner cross-section of the cooling lines is constructed in an ovular or in a flat rectangular fashion. Through the ovular or flat rectangular design of the coolant lines, the structural height, and thus the high-frequency effectiveness is, for one, reduced. On the other hand, due to the greater width, the current density, and thus local fields is minimized.

In another advantageous development, a favorable position of the terminal points for the coolant supply and drainage results, in the coolant lines having advance and return lines arranged adjacent each other.

BRIEF DESCRIPTION OF THE DRAWINGS

FIGS. 9.1, 9.2 and 9.3 illustrate different cross-sections of hollow profiles for coolant lines; and FIG. 10 illustrates in sectional fashion the structure of an electrical disconnect.

DESCRIPTION OF THE PREFERRED EMBODIMENTS

Figure 1:
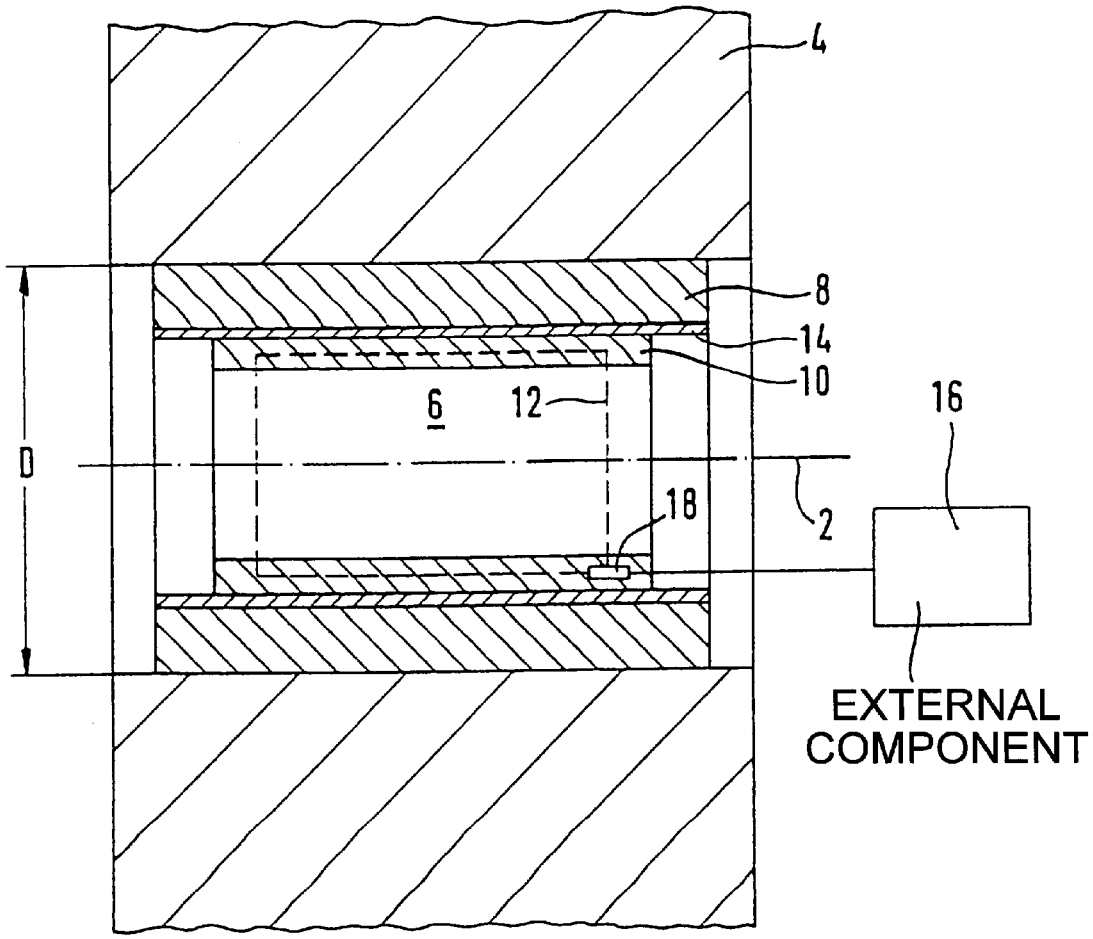
FIG. 1 shows the structure of a diagnostic magnetic resonance device, schematically in a longitudinal section.

The essential construction of a diagnostic magnetic resonance device is outlined in a sectional depiction in FIG. 1. The magnetic resonance device is constructed essentially cylindrically with a central axis of symmetry 2. As an external assembly, a basic field system 4 is provided in an annular fashion for creating a static and homogenous magnetic field in a central patient examination space 6. The basic field system 4 therein comprises superconductive coils which create a magnetic field oriented along the axis of symmetry 2. The typical magnetic field strength in the patient examination space 6 is 1 to 2 T. The basic field system 4 has a cylindrical interior space (bore) with a diameter D, in which a gradient coil system 8 is first fitted. Inside the gradient coil system 8, a carrying body 10 with a whole-body antenna 12 is connected. The whole-body antenna 12 is essentially cylindrically constructed and surrounds the patient space 6. Between the whole-body antenna 12 and the gradient coil system 8, a high-frequency shield 14 is arranged, which is permeable by the low-frequency gradient fields, but screens out the high-frequency field of the whole-body antenna 12 to the outside.

The whole-body antenna 12 is connected with a water cooling system in order to release the exhaust heat created there in transmission. In addition to coolant lines (described in the subsequent Figures) which stand in thermo conductive connection with the antenna, the cooling system comprises external components 16 arranged outside the magnetic resonance device. In the first place, a coolant conveying unit ranks among these. If the cooling system is constructed in a closed fashion, then a cooler for cooling the heated coolant is provided outside the magnetic resonance device. In the case of an open cooling system, then the heated coolant is carried away. The coolant lines connected with the antenna 12 are connected to cooling connection pieces 20 via electrical disconnects 18. The cooling connection pieces 20 are connected to the cooling system for coolant supply. The electrical disconnects 18 assure that the metallic cooling connection pieces 20 are electrically separated from the antenna.

Figure 2:
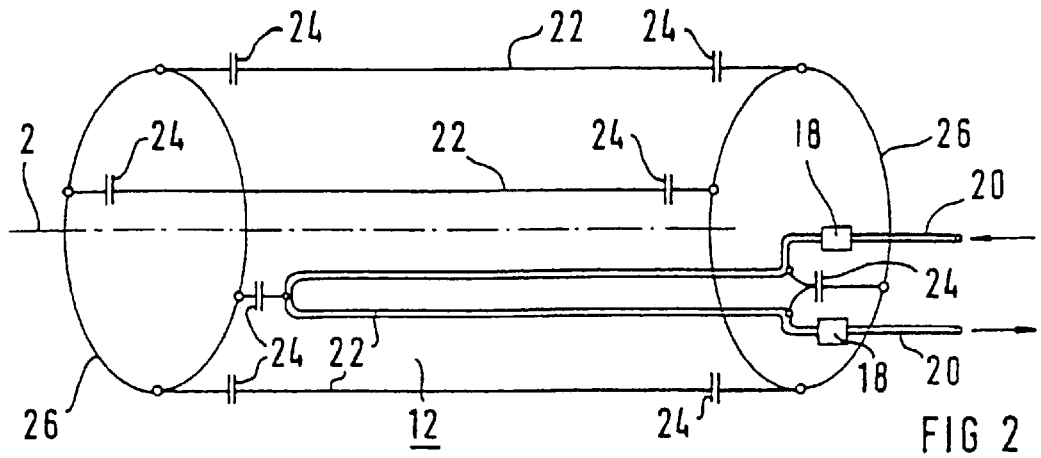
FIG. 2 illustrates schematically and in perspective the structure of a cylindrical antenna with adjacent arranged advance and return coolant lines.

FIG. 2 schematically depicts the structure of the antenna 12 in a perspective view. The antenna is constructed essentially cylindrically and comprises four longitudinal antenna conductors 22 which are arranged symmetrically on a cylinder surface in the longitudinal direction and which are connected to antenna end rings 26 via resonance capacitors 24. The antenna end rings 26 surround the axis of symmetry 2, wherein the midpoint of the antenna end rings 26 lies on the axis of symmetry 2. The longitudinal antenna conductors 22 are formed of metallic hollow profiles which are constructed simultaneously as coolant lines of the cooling system. In the exemplifying embodiment of FIG. 2, the longitudinal antenna conductors 22 comprise adjacently arranged advance and return lines for the coolant, so that a coolant inflow and drainage are arranged only on one side of the antenna 12. FIG. 2 depicts the coolant line guidance for one of the longitudinal antenna conductors only; the remaining longitudinal antenna conductors 22 are constructed accordingly. The inflow and drainage of the coolant occurs via a electrical disconnect 18, respectively, to which a cooling connection piece 20 is respectively connected 20.

Figure 3:
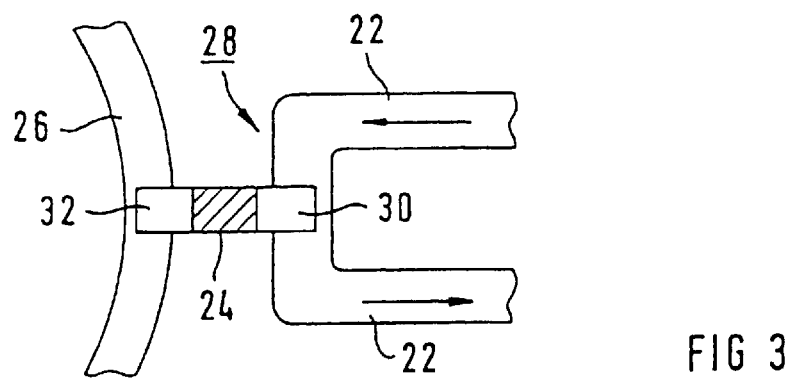
FIG. 3 illustrates in detail a first end of a cooled longitudinal conductor of the antenna according to FIG. 2.

FIG. 3 depicts in detail the left terminal of the longitudinal antenna conductor 22 with the end ring 26. The metallic hollow profile which forms the longitudinal antenna conductor 22 is bent into a U shape at the left end 28 of the antenna conductor 22, so that the coolant flow (represented by arrows) is reversed. The resonance capacitor 24 is soldered in the form of a chip capacitor with its first terminal 30 at the U-shaped end 28 of the longitudinal antenna conductor 22 and with its other terminal 32 to the end ring 26. The capacitor 24 is more intensely cooled via the terminals 30, 32 constructed as lugs.

Figure 4:
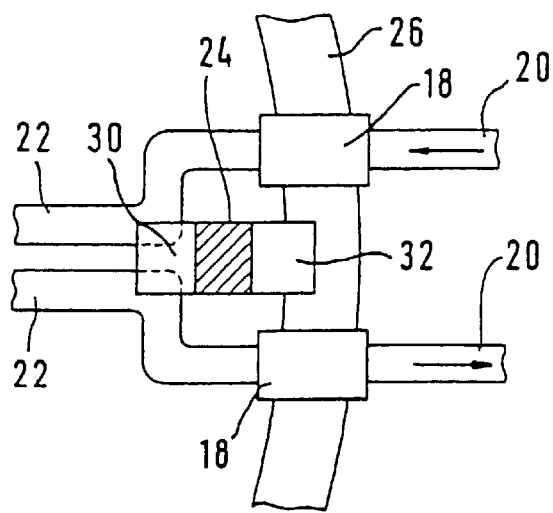
FIG. 4 illustrates in detail a second end of a cooled longitudinal conductor of the antenna according to FIG. 2.

FIG. 4 depicts the right end of the longitudinal antenna conductor 22, in detail. The right ends of the longitudinal antenna conductor 22 are connected via the electrical disconnects 18 to the cooling connection pieces 20 for the advance and return lines to the external cooling system. The arrows clearly show the flow direction of the coolant. The electrical disconnects 18 are arranged in the immediate vicinity of the right antenna end ring 26, because there the high-frequency field is oriented essentially parallel to the axis of symmetry 2 and thus the coolant present in the disconnect 18 no longer gives an image. In accordance with high frequency, the two coolant line of the longitudinal antenna conductor 22, these being guided in a parallel fashion, are soldered to the first terminal 30 of the right resonance capacitor 24; the other terminal 32 of the resonance capacitor 24 at the right side is soldered to the end ring 26.

Figure 5:
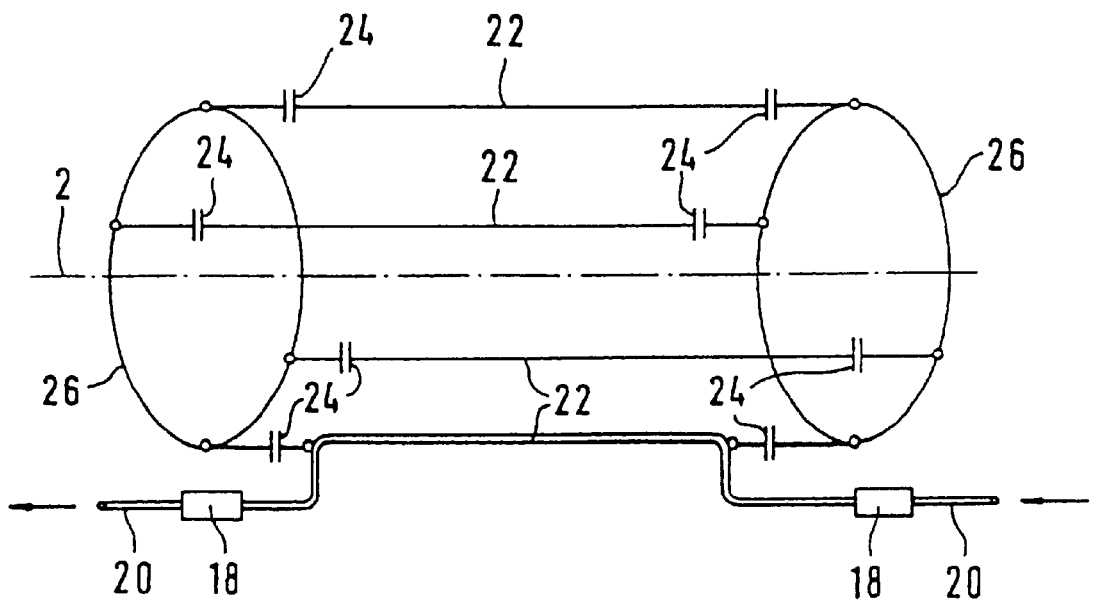
FIG. 5 shows, in perspective, the structure of a cylindrical antenna with a or single coolant line.

The configuration depicted in FIG. 5 of the coolant lines for the longitudinal antenna conductor(s) 22 results in a simple structure of the cooling system inside the high-frequency antenna. As longitudinal antenna conductor 22, only a single coolant line in the form of a metallic hollow profile is used therein, this line being connected at the left side to a coolant inflow, and at the right side to a coolant drainage via a respective electrical disconnect 18, which is clearly shown by the arrows which have been drawn in. The electrical disconnects 18 are therein likewise located in the immediate vicinity of the antenna end rings 26.

Figure 6:
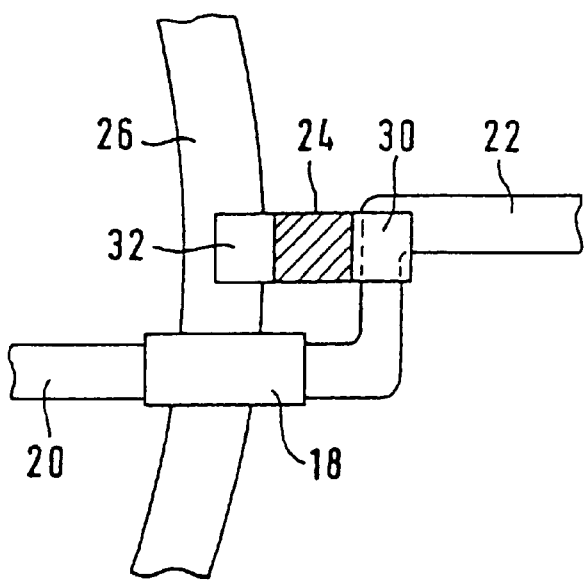
FIG. 6 illustrates in detail a first end of a cooled longitudinal conductor according to FIG. 5.

FIG. 6 depicts in detail the coolant line guidance as well as the terminals of the resonance capacitors 24. A terminal 30 is in turn connected to the longitudinal antenna conductor 22, and the second terminal 32 is connected with the antenna end ring, whereby a cooling of the capacitor 24 is assured in this case also.

Figure 7:
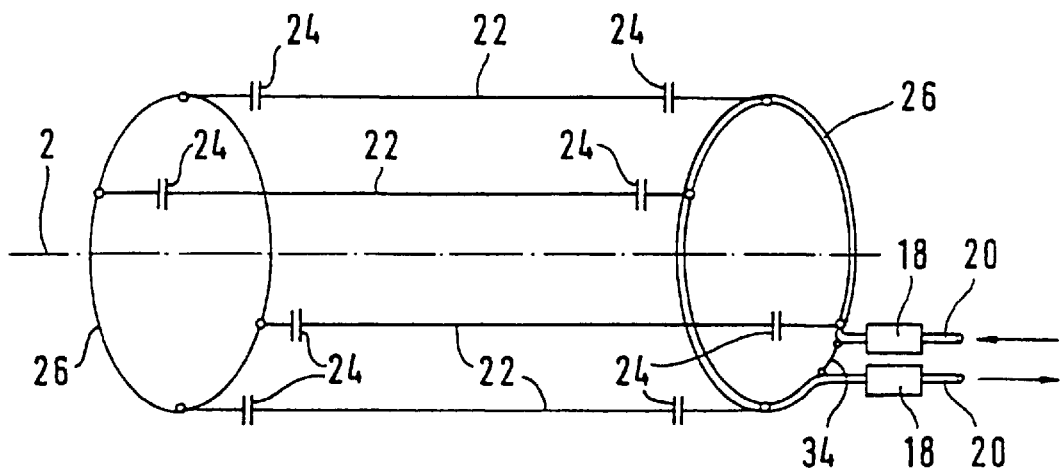
FIG. 7 shows schematically and in perspective a cooled end ring conductor of a cylindrical antenna according to FIG. 2 or FIG. 5.

FIG. 7 depicts the configuration of the cooled antenna end ring 26. The longitudinal antenna conductors 22 are constructed as described either in FIG. 2 or in FIG. 5. A cooled antenna end ring 26 is exemplarily depicted in FIG. 7; however, the two antenna end rings 26 consist of an annularly bent metal hollow profile which is connected via two electrical disconnects 18 to cooling connection pieces 20 for the feeding and draining of the coolant. The arrows which have been drawn in show the flow direction. In accordance with high frequency, the antenna end ring 26 is closed in the vicinity of the electrical disconnects 18, either in a directly electrical fashion or via a capacitor. This electrical connection is characterized by the reference character 34. As already described using the FIGS. 3, 4, 6, the capacitors 24 with a terminal 32 are soldered to the antenna end ring 26.

Figure 8:
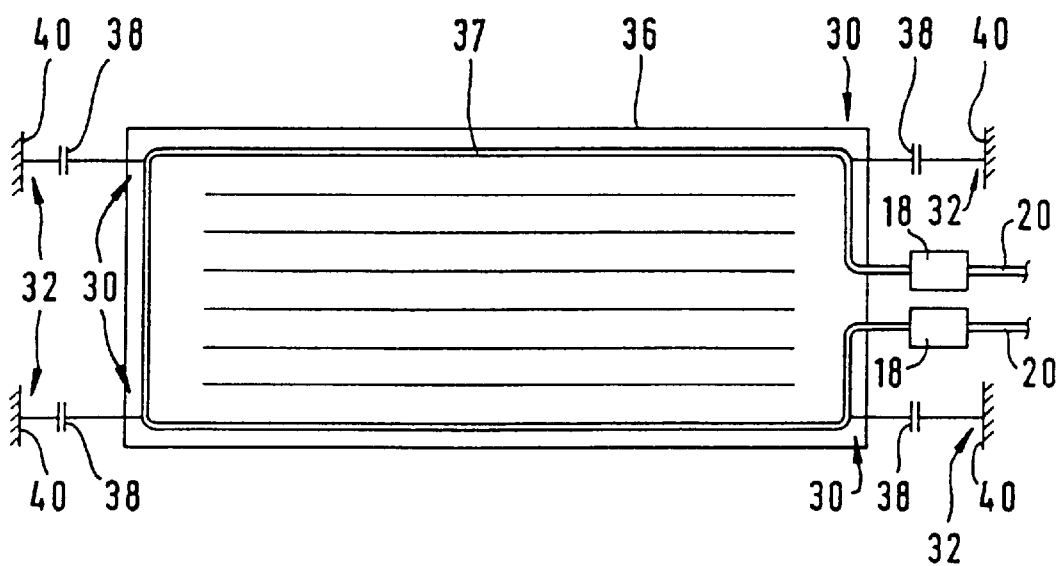
FIG. 8 shows in plan view the structure of a cooled longitudinal antenna conductor, constructed in a flat fashion.

FIG. 8 depicts an antenna conductor structure 36 constructed in a flat fashion, wherein coolant lines 37 are glued or soldered with good thermoconductivity on the antenna conductor structure 36. The antenna conductor structure 36 is connected via terminal capacitors 38 to the interior of a high-frequency shield in the shape of a cylinder cladding, this shield being only symbolically depicted here by chassis potential or reference potential reference numeral 40. The high-frequency currents flow essentially longitudinally on the antenna conductor structure 36 and terminate via the high-frequency shield 40. The coolant lines 37 are arranged in the vicinity of the edges of the antenna conductor structure 36, since the high-frequency antenna currents also flow essentially along the edges. Therein, too, the coolant lines 37 are connected via electrical disconnects 18 to the cooling connection pieces 20 for feeding and draining the coolant. The terminal lugs of the capacitors 38 are soldered in between the flat antenna conductor structure 36 and the coolant line, for example.

Using the FIG. 9.1–9.3, the high-frequency behavior of various metallic hollow profiles for the coolant lines in the magnetic resonance device are detailed. FIG. 9.1 depicts a cross section of a circular profile as the simplest configuration of a hollow profile. In magnetic resonance devices of 1 T or 1.5 T. the influence on the resonance frequency of the antenna is minimized, as are additional fields or field distortions in the field profile of the antenna, if the inner diameter d is constructed smaller than 5 mm. Likewise, in the dimensioning of the flat hollow conductor profiles in FIGS. 9.2 and 9.3, it also holds that the high-frequency effectiveness is minimized given a height of the inner diameter h of less than 5 mm. Relative to the circular ring hollow profile depicted in FIG. 9.1, through the flat configuration of the hollow profile depicted in FIGS. 9.2 and 9.3, the current density is additionally minimized, whereby local field increases in the immediate vicinity of the antenna conductor structure are largely avoided.

FIG. 10 depicts a cross section of an electrical disconnect 18 which is constructed as a plastic insert and which connects the coolant lines at the antenna side to the metallic cooling connection pieces 20. The inner cross-section of the electrical disconnect 18 is tapered relative to the inner cross-section of the connected cooling line, whereby a higher flow rate of the coolant results inside the electrical disconnect 18. The flow rate must therein exceed the length L of the unshielded section divided by the distance between an excitation impulse for exciting the nuclear magnetic resonance and the reception of the magnetic resonance signals emitted by the excited volume. During reception, the volume VA present in the electrical disconnect in the excitation must be transported again entirely in the metallic part of the cooling system. The advanced position of the excited coolant volume during reception is depicted in FIG. 10 by the hatched rectangle VE. The magnetic resonance signals emitted by the excited coolant volume VE are shielded by the metal hollow profile connected to the disconnect, and thus cannot be received.

Although various minor modifications might be suggested by those skilled in the art, it should be understood that our wish to embody within the scope of the patent warranted hereon all such modifications as reasonably and properly come with the scope of our contribution to the art.

We claim as our invention:

1. An antenna for a magnetic resonance device, comprising:

an antenna conductor structure and capacitors connected to the conductor structure;

at least one of the elements selected from the group consisting of the antenna conductor structure and at least one of the capacitors being connected to a water cooling system; and the water cooling system comprises coolant lines and at least one of the elements selected from the group consisting of the antenna conductor structure and at least one of the capacitors being connected to the coolant lines in a thermo conductive manner.

2. The antenna according to claim 1 wherein the coolant lines have an inner cross-section which is shielded with a high-frequency shielding against penetration and escape of high-frequency signals.

3. The antenna according to claim 1 wherein the coolant lines comprise metallic hollow profiles which are in thermo conductive connection to at least one part of the antenna conductor structure.

4. The antenna according to claim 1 wherein at least one part of the antenna conductor structure is constructed as coolant lines in the form of metallic hollow profiles.

5. The antenna according to claim 1 wherein the coolant lines are connected via electrical disconnects to terminal connection pieces.

6. The antenna according to claim 5 wherein the electrical disconnects and the coolant lines have an inner cross-section, respectively, and the inner cross-section of the electrical disconnect is constructed smaller than the inner cross-section of the coolant lines connected to the electrical disconnect.

7. The antenna according to claim 5 wherein the antenna structure is constructed substantially cylindrically, and the electrical disconnects are arranged at a front side of the antenna conductor structure.

8. The antenna according to claim 1 wherein an inner cross-section of the coolant lines is constructed in an ovular fashion.

9. The antenna according to claim 1 wherein an inner cross-section of the coolant lines is constructed in a rectangular fashion.

10. The antenna according to claim 3 wherein coolant lines are soldered to at least one part of the antenna structure.

11. The antenna according to claim 1 wherein the coolant lines comprise adjacently arranged advance and return lines.

12. A magnetic resonance device, comprising:

a central patient examination space and a whole-body antenna surrounding the central patient examination space;

a high frequency shield surrounding the antenna;

a gradient coil system outwardly of the high frequency shield;

a basic field system outwardly of the gradient coil systems;

the whole-body antenna comprising an antenna conductor structure with connected capacitors; and at least one part of the antenna being formed to carry a coolant.

13. An antenna for a magnetic resonance device, comprising:

an antenna conductor structure and capacitors connected to the conductor structure; and at least one part of the antenna conductor structure and capacitors comprising a coolant line.

* * * * *